United States Patent
Kothandaraman et al.

(10) Patent No.: US 7,994,848 B2
(45) Date of Patent: Aug. 9, 2011

(54) LOW POWER VOLTAGE REFERENCE CIRCUIT

(75) Inventors: Badri Kothandaraman, Bangalore (IN); Arun Khamesra, Bangalore (IN); T. V. Chanakya Rao, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 93 days.

(21) Appl. No.: 11/714,951

(22) Filed: Mar. 7, 2007

(65) Prior Publication Data

US 2007/0241809 A1 Oct. 18, 2007

Related U.S. Application Data

(60) Provisional application No. 60/793,489, filed on Apr. 19, 2006.

(30) Foreign Application Priority Data

Mar. 7, 2006 (IN) .............................. 395/CHE/2006

(51) Int. Cl.
G05F 1/10 (2006.01)
G05F 3/02 (2006.01)

(52) U.S. Cl. ........................................ 327/539; 327/541

(58) Field of Classification Search ................... 327/538
See application file for complete search history.

(56) References Cited

U.S. PATENT DOCUMENTS

| 7,180,349 B2 * | 2/2007 | Leifso et al. .................. 327/217 |
| 7,321,225 B2 * | 1/2008 | Garlapati et al. ............. 323/313 |
| 2006/0103455 A1 * | 5/2006 | Zhang et al. .................. 327/543 |

FOREIGN PATENT DOCUMENTS

JP 10143264 * 5/1998

OTHER PUBLICATIONS

Cypress Semiconductor "CMOS Current Reference Without Resistance," Henri J. Oguey dated Jul. 7, 1997; 4 pages.
Liu et al., "Process and Temperature Performance of a CMOS Beta-multiplier Voltage Reference", Midwest Symposium on Systems and Circuits, Aug. 09-12, 1998, South Bend, Indiana; 4 pages.
Giustolisi, "A Low-Voltage Low-Power Voltage Reference Based on Sub threshold MOSFETs", IEEE J. Solid-State Circuits, vol. 38, No. 1 p. 151-154, Jan. 2003; 4 pages.

* cited by examiner

*Primary Examiner* — Lincoln Donovan
*Assistant Examiner* — Daniel Rojas (57) ABSTRACT

An embodiment of the present invention is directed to a low power voltage reference circuit. The circuit includes a first circuit for generating a PTAT voltage without using an operational amplifier. The circuit also includes a second circuit for generating the reference voltage. The first and the second circuit do not utilize a resistor.

11 Claims, 8 Drawing Sheets

LOW POWER VOLTAGE REFERENCE CIRCUIT

CLAIM OF PRIORITY UNDER 35 U.S.C. §119

The present Application for Patent claims priority to Indian Patent Application No. 395/CHE/2006 filed Mar. 7, 2006, and assigned to the assignee hereof and hereby expressly incorporated by reference herein.

The present Application for Patent claims priority to U.S. Provisional Application No. 60/793,489 entitled "A RESISTOR-LESS BANDGAP REFERENCE FOR MICRO-POWER MEMORIES and LOW-POWER LOW VOLTAGE MOSFET BASED VOLTAGE REFERENCE" filed Apr. 19, 2006, and assigned to the assignee hereof and hereby expressly incorporated by reference herein.

BACKGROUND

Figure 1:
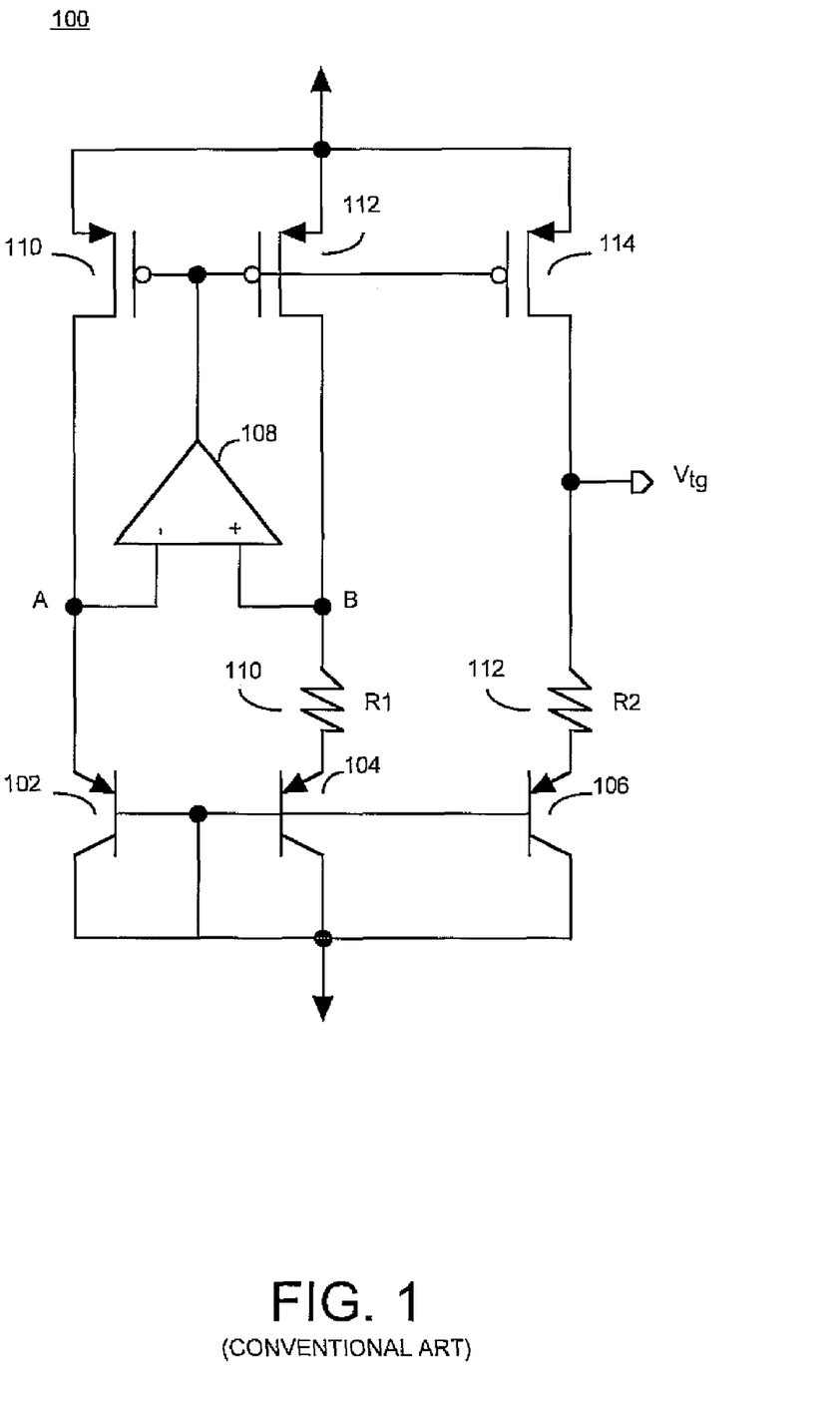
FIG. 1 shows a circuit schematic of a conventional band-gap voltage reference.

Conventionally, obtaining a sub-100 nA micro-power voltage reference for micro-power wide voltage range memory applications required very large matched resistors to achieve a low current, bipolar junction transistors (BJT), and an amplifier to generate a proportional to absolute temperature (PTAT) voltage. FIG. 1 illustrates a circuit schematic for a conventional band-gap voltage reference circuit 100. The large resistors (R1 and R2) are not generally suitable as micro-power components. Furthermore, the use of BJTs 102-106 and resistors R1-R2 introduces BJT mismatch and resistor mismatch.

One purpose of a band gap voltage reference is to balance the negative temperature coefficient of a P-N junction with the thermal voltage ($V_T$, where $V_T = KT/q$). In FIG. 1, the reference voltage $V_{bg}$ can be expressed as follows:

$$V_{bg} = V_{eb106} + K_1 * V_T. \quad (1)$$

The amplifier 108 generates a PTAT voltage across resistor 110 by equalizing nodes A and B. The current through resistor 110 can be expressed as follows:

$$\begin{aligned} I &= \frac{\Delta V_{R1}}{R1} \\ &= \frac{V_{eb102} - V_{eb104}}{R1} \\ &= \frac{V_T \ln(I/I_S) - V_T \ln\left(\frac{I}{I_S * K_2}\right)}{R1}, \\ &= \frac{V_T \ln(K_2)}{R1} \end{aligned} \quad (2)$$

where the m-factor $K_2$ is equal to 8. $V_{bg}$ can alternatively be expressed as:

$$V_{bg} = V_{eb106} + I * R2. \quad (3)$$

Upon substituting the expression of I from Equation 2 into Equation 3:

$$V_{bg} = V_{eb106} + R2/R1 * \ln(8) * V_T \quad (4)$$

Thus, it should be clear from Equation 4 that $$K_1 = R2/R1 * \ln(K_2) \quad (5)$$

Thus, establishing a band-gap reference voltage in the conventional art depended heavily on the values of R1 and R2.

Figure 2:
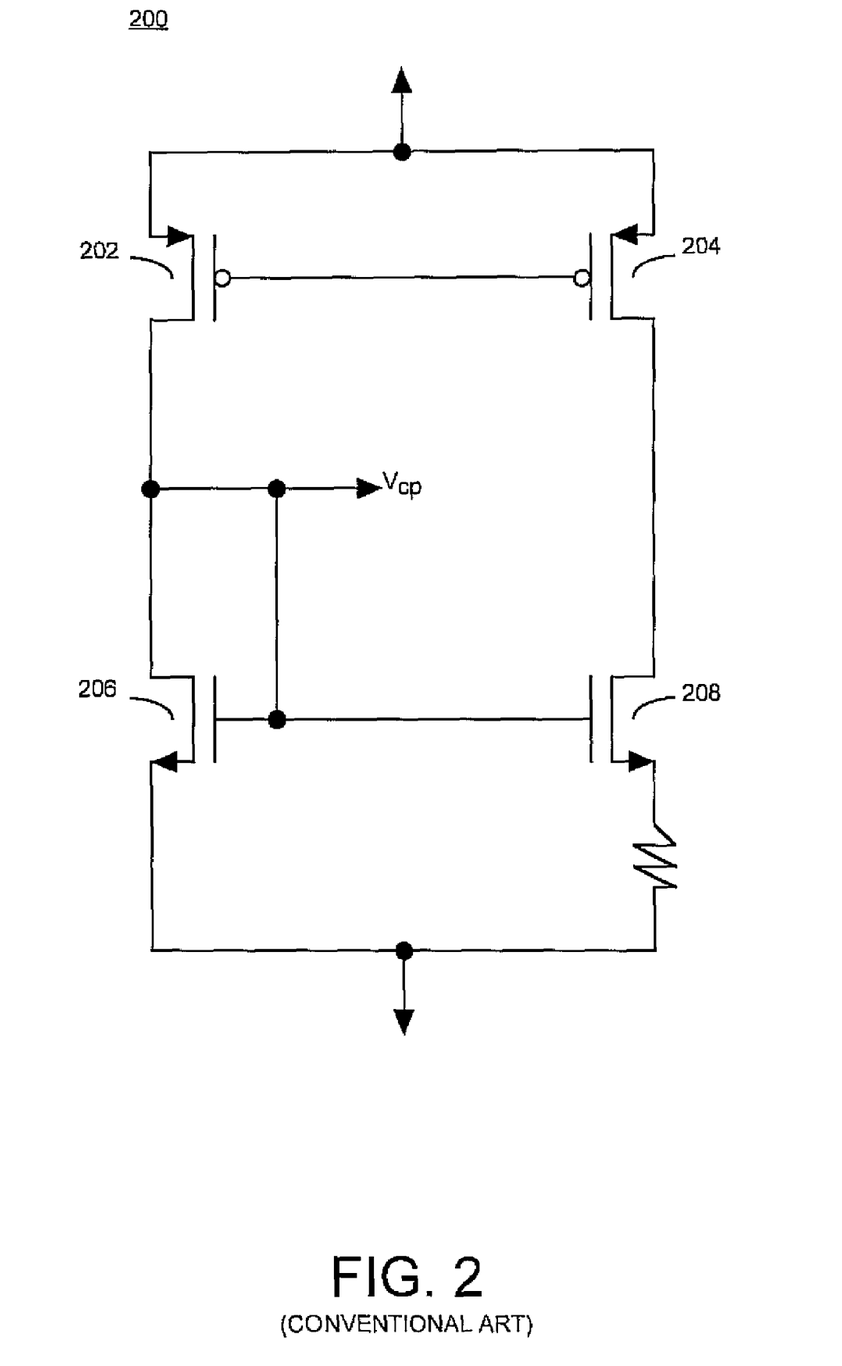
FIG. 2 shows a circuit schematic of a conventional beta multiplier voltage reference.

Beta multiplier voltage references have been developed in the past that do not require the use of a BJT. FIG. 2 is a circuit schematic for one such conventional circuit 200 for generating a beta multiplier voltage reference. When MOSFETS 202-208 operate in the sub-threshold region, the relationship between $I_{DS}$ and $V_{GS}$ depends strongly on Vt variations with respect to temperature. Thus $I_{DS}$ at 90° C. would be greater than $I_{DS}$ at 27° C. On the other hand, when MOSFETS 202-208 operate in the strong inversion region, the relationship between $I_{DS}$ and $V_{GS}$ depends strongly on Mobility ($u_n$) variations with respect to temperature. Thus $I_{DS}$ at 90° C. would be less than $I_{DS}$ at 27° C.

Figure 3:
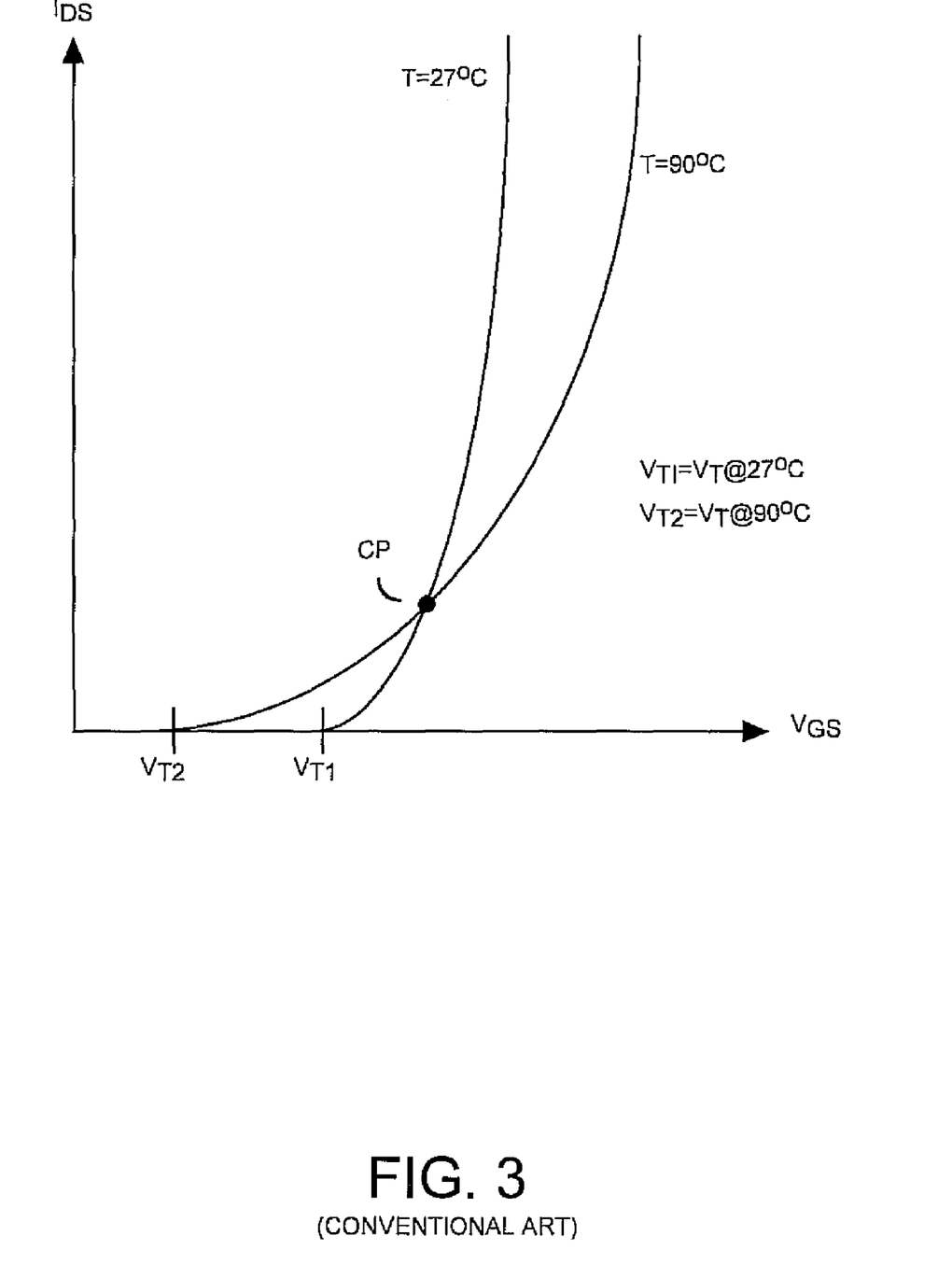
FIG. 3 is an $I_{DS}$ vs. $V_{GS}$ curve, illustrating a temperature insensitive point in a MOSFET's transfer characteristic.

FIG. 3 is an $I_{DS}$ vs. $V_{GS}$ curve illustrating a MOSFET's transfer characteristic for two different temperatures. The principle behind beta multiplier voltage references is that there exists a temperature-insensitive value of $V_{GS}$ for a given $I_{DS}$. This point is denoted as point CP in FIG. 3. However, the temperature insensitivities of circuits such as circuit 200 strongly depend on MOSFET modeling and do not account for threshold voltage and mobility variations with respect to temperature or the variations in resistance. Consequently, these circuits require a significant amount of on-chip trimming.

SUMMARY

Accordingly, embodiments of the present invention eliminate the need for the resistors and the amplifier discussed above and also reduce the number of BJTs required for a voltage reference circuit. Embodiments also help to eliminate excessive dependence on MOSFET models so as to eliminate the need for on-chip trimming.

An embodiment of the present invention is directed to a low power voltage reference circuit. The circuit includes a first circuit for generating a PTAT voltage without use of an operational amplifier. The reference circuit also includes a second circuit for generating the reference voltage. The first and the second circuit are resistor-free, e.g., they do not use resistors.

Another embodiment of the present invention is directed to a circuit for generating a band-gap voltage reference including a first transistor coupled with a first output of a current reference circuit. The first transistor is operable to generate a bias current that is proportional to a reference current of the current reference circuit. The reference current is proportional to a temperature measurement. The novel circuit also includes a diode-connected transistor coupled with the first transistor and a second transistor coupled with said first transistor and said second transistor, wherein said reference voltage is generated at a drain of said diode-connected transistor. The reference voltage is generated at a drain of the diode-connected transistor.

This embodiment of the present invention is capable of achieving a band-gap reference of minimal variation (1.24V +/−20 mV, for instance) across a wafer in the temperature range of −45° C. to 95° C., for instance. The voltage reference is achieved with an ultra low sub-100 nA operating current. This embodiment is applicable for micro-power applications requiring low standby current, for example.

Another embodiment of the present invention is directed to a circuit for generating a low-power, low-voltage voltage reference including a PMOS transistor coupled with an output of a current reference circuit. The current reference circuit generates a reference current that is proportional to a temperature measurement. The novel circuit also includes a diode-connected transistor coupled with the PMOS transistor. The voltage reference is generated at a drain of said diode-connected transistor.

This embodiment has several benefits over conventional voltage reference circuits. For example, the circuit's dependency on MOSFET models has been minimized and depends on Vt modeling. The circuit also has low power requirements (≦300 nA of current, for instance). The circuit can also operate at low voltage (up to Vt+300 mV, for instance). Additionally, in one embodiment, the circuit's temperature coefficient is less than 200 ppm/° C. Furthermore, the reference may be adaptive with respect to process.

Thus, embodiments of the present invention are able to advantageously provide a reference voltage without using resistors or amplifiers. As a result, circuit area and operating current are reduced. Moreover, problems associated with resistor matching are eliminated. These advantages translate generally into lower cost and lower power consumption compared to conventional voltage reference circuits.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 4:
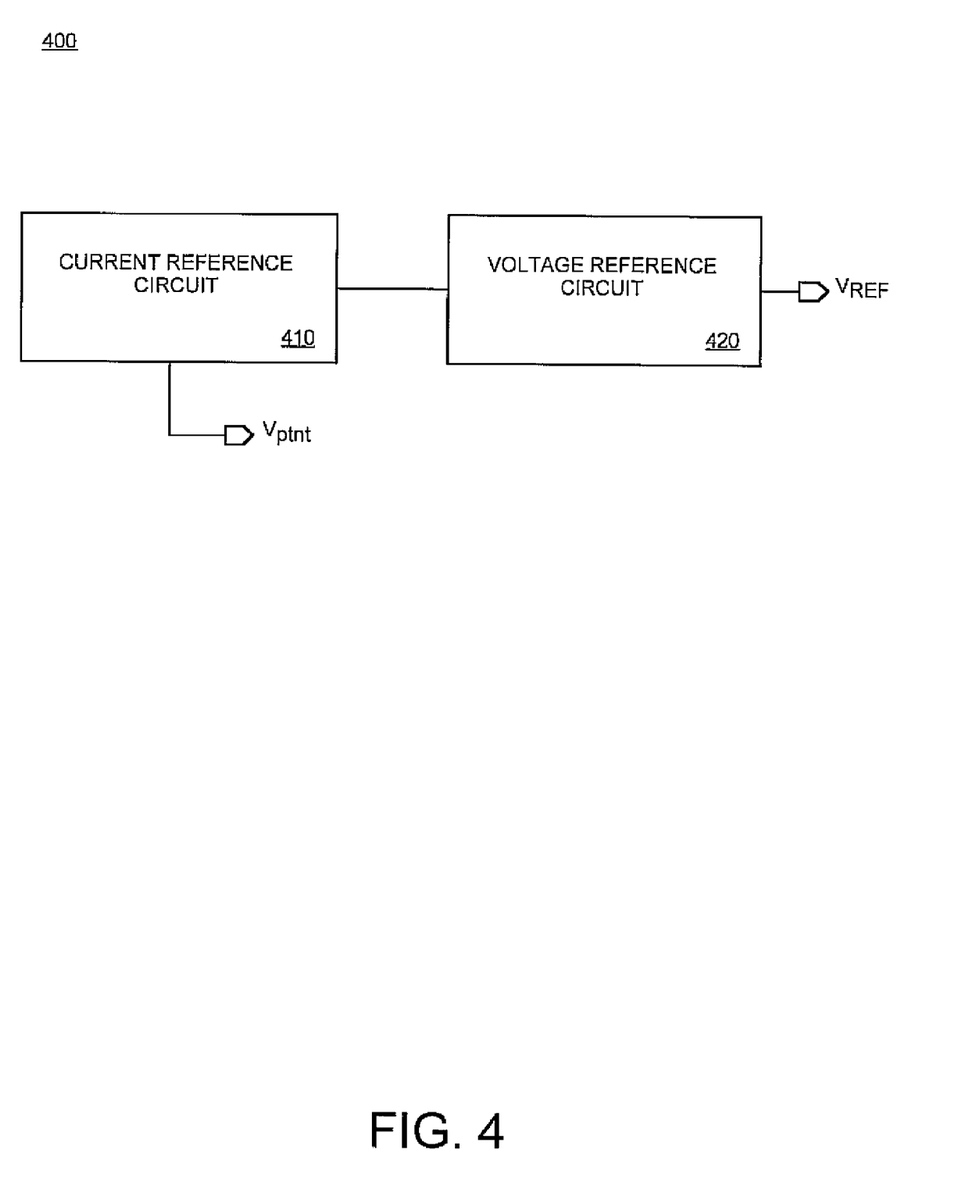
FIG. 4 shows an exemplary circuit schematic of a resistor-less current reference, in accordance with an embodiment of the present invention.

FIG. 4 illustrates a block diagram of a low power voltage reference circuit 400, in accordance with various embodiments of the present invention. Circuit 400 may be well-suited for use in, for example, memory applications. In one embodiment, circuit 400 advantageously uses no resistors. As such, the problems associated with resistor mismatch of conventional designs are eliminated. Furthermore, circuit 400 has a smaller on-chip footprint than conventional circuits.

Circuit 400 includes a current reference circuit 410. The current reference circuit 410, which uses no resistors, is operable to generate a reference current. The current reference circuit 410 is also operable to generate a PTAT voltage ($V_{ptat}$) without using an operational amplifier. For example, in one embodiment, the current reference circuit 410 contains no operational amplifier.

Figure 5:
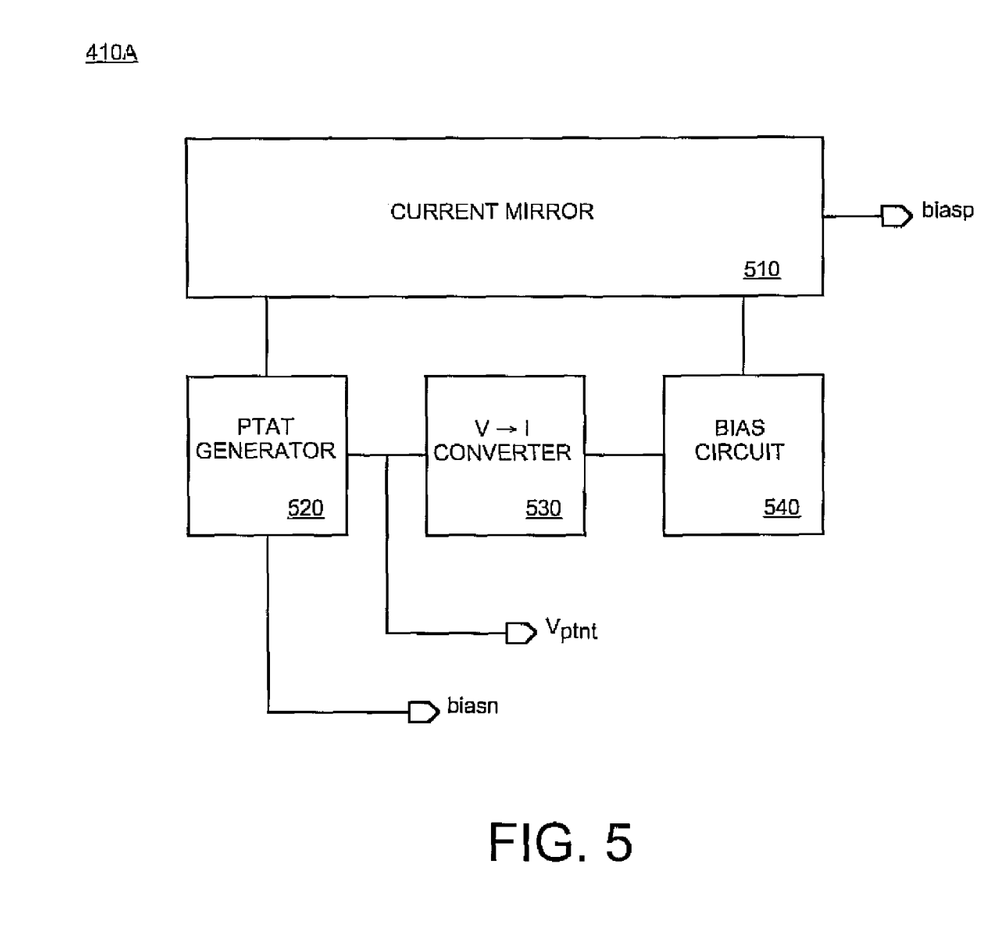
FIG. 5 shows an exemplary circuit schematic of a resistor-less band-gap voltage reference, in accordance with an embodiment of the present invention.

FIG. 5 illustrates a block diagram of a current reference circuit 410A, in accordance with various embodiments of the present invention, which may be used in circuit 400. The current reference circuit 410A includes a current mirror 510 for mirroring the reference current within the current reference circuit 410A and to other circuits coupled with the current reference circuit 410A. In one embodiment, the current reference circuit 410A generates the output signal "bias_p," which may be used by another circuit to mirror the reference current. The current reference circuit 410A also includes a PTAT generator 520 coupled with the current mirror 510. In one embodiment, the PTAT generator is operable to generate the PTAT voltage ($V_{ptat}$) without use of an operational amplifier. The PTAT generator may also be operable to generate the signal "bias_n," which may be used to bias another circuit. The current reference circuit 410A may also include a V-I converter 530 for converting a voltage signal to a current signal. In one embodiment, the V-I converter is coupled with the PTAT generator and is operable to convert $V_{ptat}$ to a PTAT current ($I_{ptat}$). The reference current of the current reference circuit 410A may then be based on $I_{ptat}$. The current reference circuit 410A may also include a bias circuit 540 for biasing the V-I converter 530.

Figure 6:
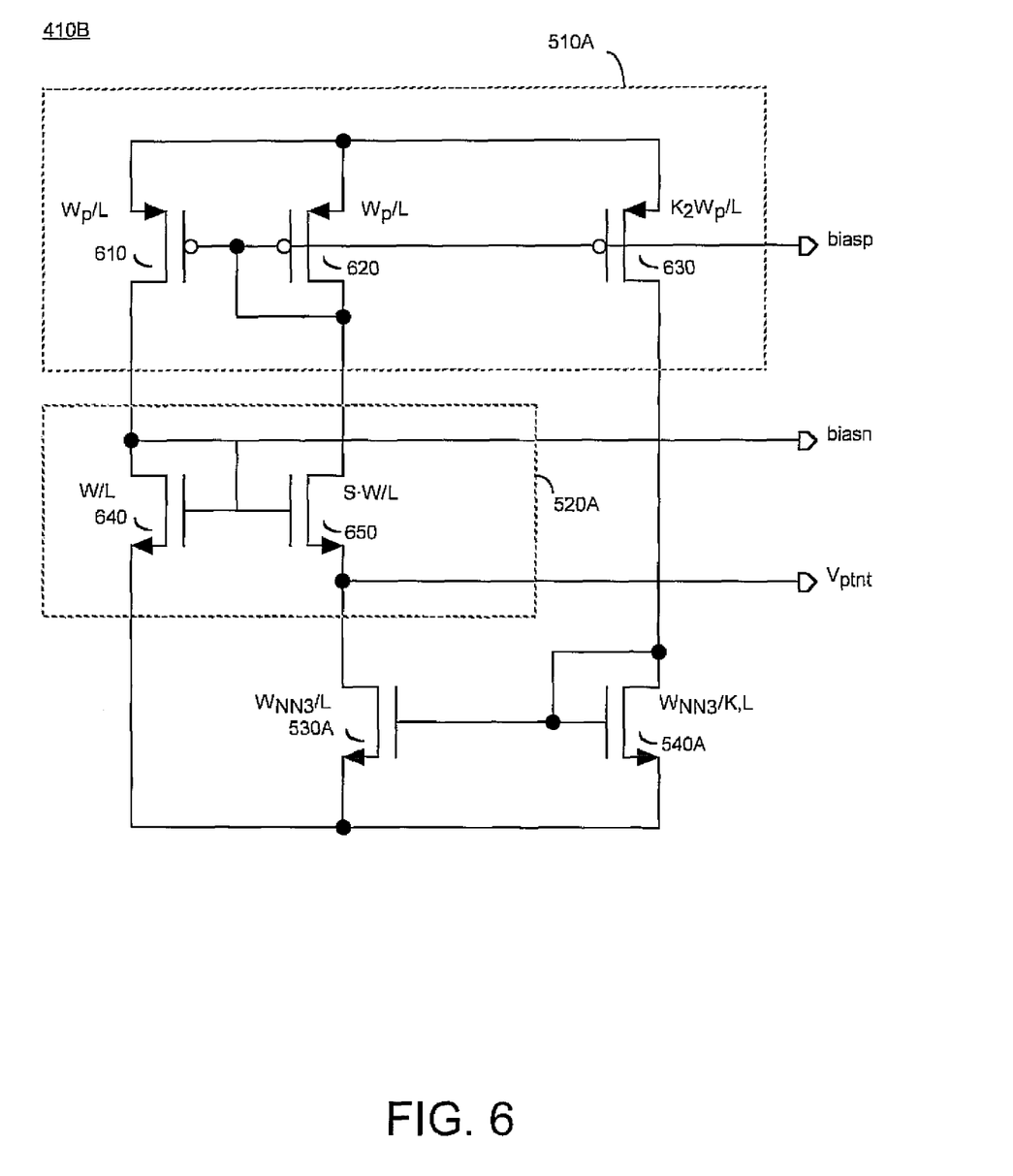
FIG. 6 shows an exemplary circuit schematic of a low power, low voltage MOSFET based voltage reference, in accordance with an embodiment of the present invention.

FIG. 6 illustrates a detailed schematic of a current reference circuit 410B, in accordance with various embodiments of the present invention, which may be used in circuit 400. In current reference circuit 410B, transistors 610, 620, and 630 act as a current mirror 510A. Transistors 640 and 650 are coupled with transistors 610 and 620 respectively. In this configuration, transistors 640 and 650 operate in sub-threshold region and serve as a PTAT generator 520A for generating the PTAT voltage $V_{ptat}$, thereby eliminating the need for an amplifier. The current reference circuit 410B also includes transistor 530A, which is coupled with transistor 650. As configured, transistor 530A is operable to convert $V_{ptat}$ to $I_{ptat}$. In one embodiment, transistor 530A is a MOSFET operating in the linear region and thus taking the place of a resistor. The current reference circuit 410B may also include a transistor 540A, which may be used to bias transistor 530A.

Consequently, the reference current through the current reference circuit 410B is:

$$I = 8 * \beta_{530A} * \eta^2 * V_T^2 * \ln^2(S) \tag{6}$$

Ignoring the constant terms in Equation 6, the relationship can be reduced to:

$$I \propto \beta_{530A} * V_T^2. \tag{7}$$

Noting that $\beta_{530A} \propto C_{OX} * \mu_n$, and $\mu_n \propto T^{-1.6}$, where T is Absolute Temperature, and $V_T \propto T$, this relationship can be rewritten as:

$$I \propto \beta_{530A} * V_T^2 \propto C_{OX} * T^{-1.6} * T^2 \propto C_{OX} * T^{0.4} \tag{8}$$

Thus, the current is nearly constant across the Transistor Process Voltage and Temperature. Therefore, this current can be used to advantageously bias a voltage reference stage 420 of the circuit 400.

With reference again to FIG. 4, circuit 400 includes a voltage reference circuit 420 for generating a reference voltage $V_{REF}$. Voltage reference circuit 420 advantageously uses no resistors.

Figure 7:
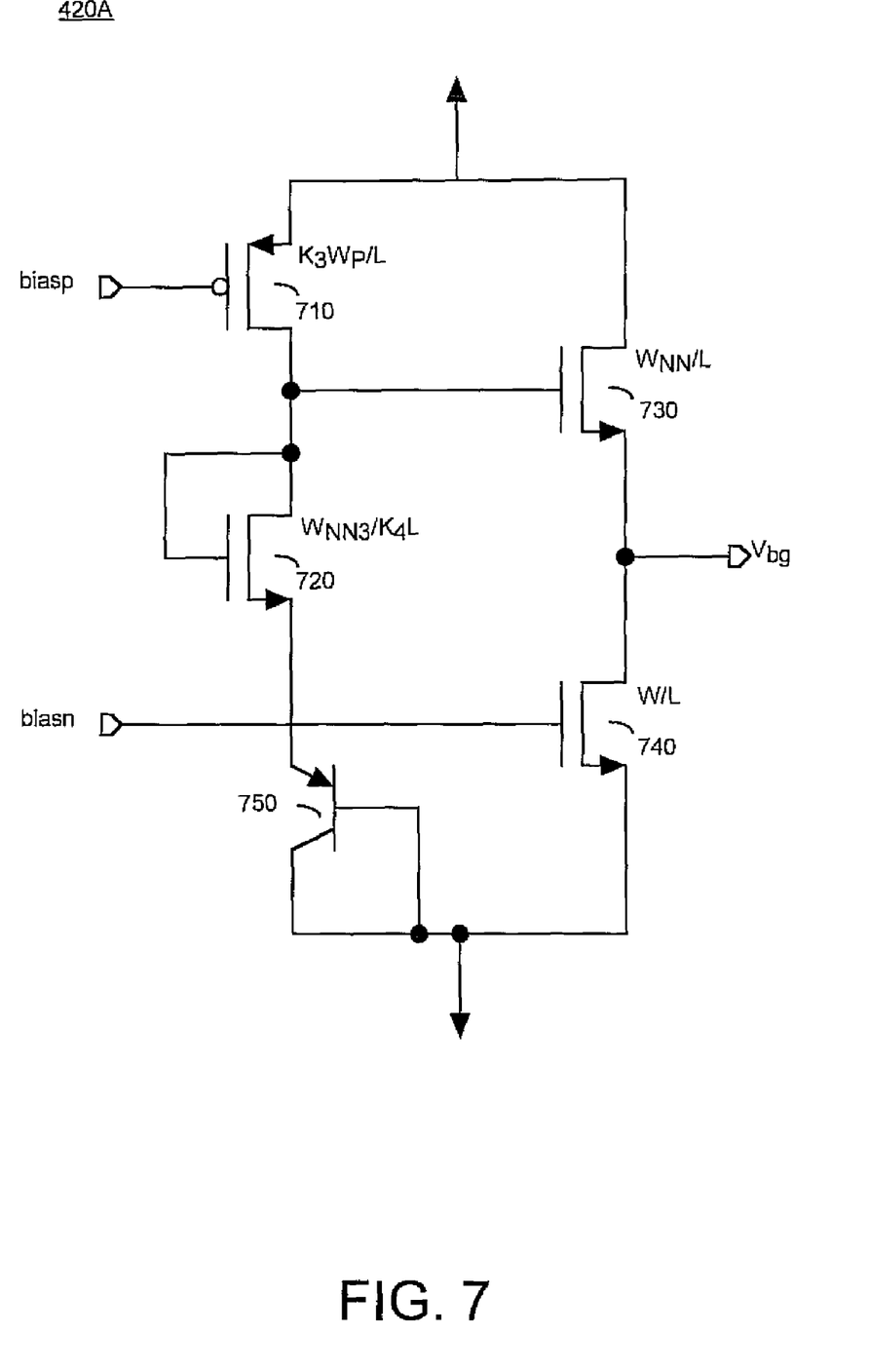
FIG. 7 illustrates a schematic for a band-gap voltage reference circuit 420A, in accordance with various embodiments of the present invention.

In one embodiment, the reference voltage $V_{REF}$ is a band-gap reference (e.g., $V_{bg}$). FIG. 7 illustrates a schematic for a band-gap voltage reference circuit 420A, in accordance with various embodiments of the present invention, which may be used by circuit 400. Circuit 420A includes a transistor 710, which mirrors the current from circuit 410 (or circuit 410A). The band-gap voltage reference circuit 420A also includes a BJT 750, which has an emitter voltage of $V_{EB}$. Circuit 420A also includes a diode-connected transistor 720, which acts as a resistor. It should be appreciated that this configuration of transistor 720 therefore obviates the need for a resistor. The negative temperature variation due to the BJT 750 is cancelled by the positive temperature coefficient of the overdrive of transistor 720.

In one embodiment, the band-gap voltage reference circuit 420A also includes transistors 730 and 740, which serve as a simple voltage follower and remove a $V_{th}$ component of the drain voltage of transistor 720. The reference voltage $V_{bg}$ from FIG. 7 can be expressed as:

$$V_{bg}=V_{EB}+V_{GS720}-V_{GS730}. \quad (9)$$

Here, $V_{GS720}=V_t+\sqrt{2*4*I/\beta_{720}}$ and $V_{GS730} \approx V_t$. On substituting these $V_{GS}$ values into Equation 9, $$V_{bg}=V_{EB}+\sqrt{2*4*I/\beta_{720}}. \quad (10)$$

In one embodiment, the transistors 710 and 720 of voltage reference circuit 420A and transistor 530A of current reference circuit 410A are selected so that $\beta_{530A}/\beta_{720}=2$ and $K_3=4$. On substituting the I given in Equation 6 into Equation 10, $$V_{bg}=V_{EB}+\eta*V_T*\ln(4)*\sqrt{2*2*4*8}=V_{EB}+19.2*V_T \approx 1.24 V, \quad (11)$$

at room temperature. Thus, by appropriate selection of transistors 530A and 720, the β terms can be cancelled out. In one embodiment, transistors 640, 650, 530A, 540A, and 720-740 in FIGS. 6-7 may be native NMOS transistors, which allows for lower supply voltage operation.

Thus, this embodiment of the present invention is capable of achieving a band-gap reference of minimal variation (1.24V+/-20 mV) across a wafer in the temperature range of -45° C. to 95° C., for instance. The voltage reference is achieved with an ultra low sub-100 nA operating current. This embodiment is applicable for micro-power applications requiring low standby current, for example.

Figure 8:
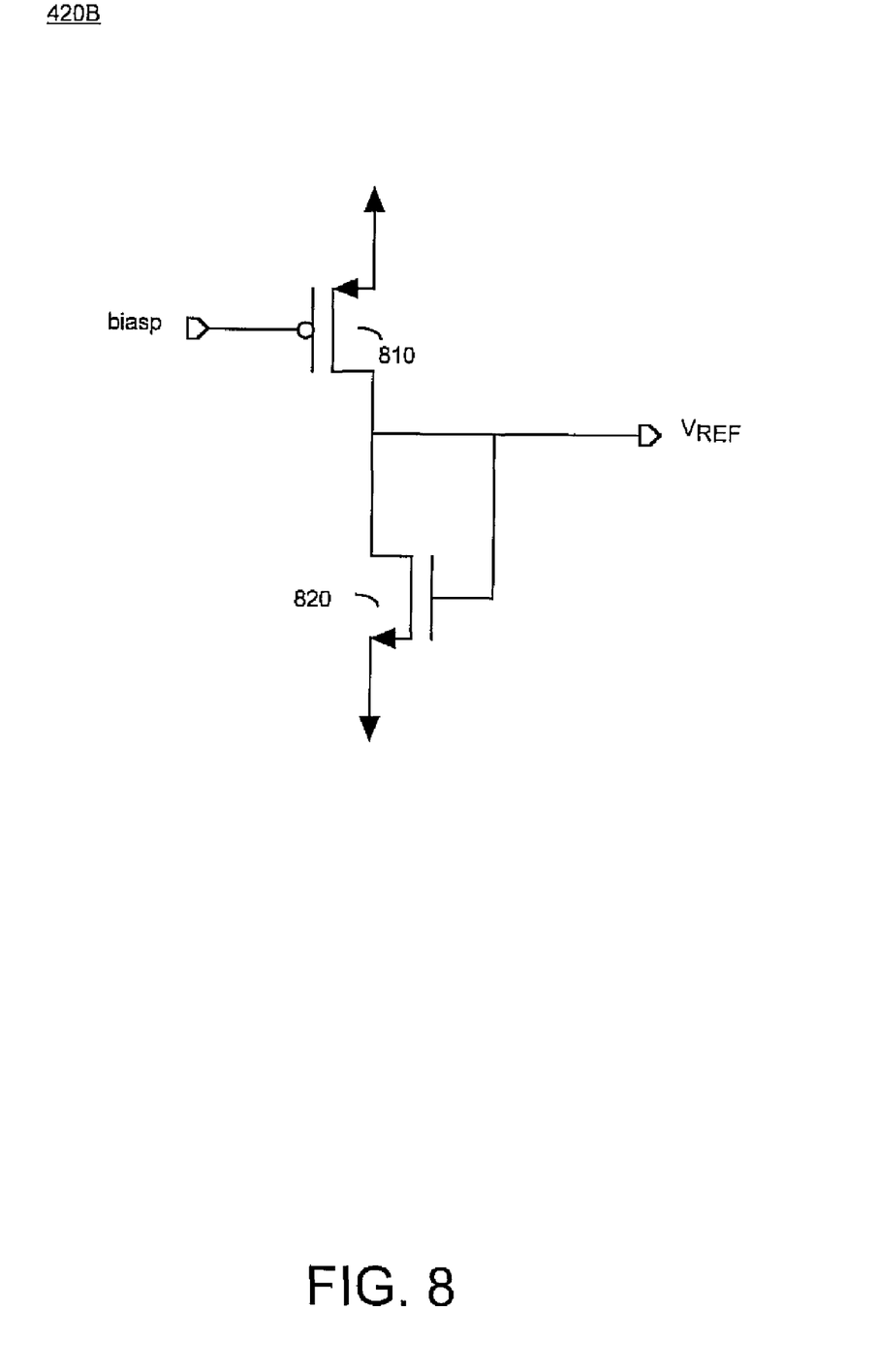
FIG. 8 illustrates a schematic for a voltage reference circuit 420B, in accordance with various embodiments of the present invention.

FIG. 8 illustrates a schematic for a voltage reference circuit 420B, in accordance with various embodiments of the present invention, which may be used in circuit 400. Voltage reference circuit 420B is particularly useful in low power applications and low voltage applications. It should be appreciated that voltage reference circuit 420B does not require a resistor or a BJT to generate the voltage reference $V_{REF}$. For example, transistor 820 is diode-connected and therefore operates similar to a resistor. Moreover, because BJTs can become inaccurate at sub-nA currents (e.g., 10 nA), it is therefore advantageous to generate $V_{REF}$ without using a BJT. In one embodiment, the current reference circuit 410B of FIG. 6 is connected to the voltage reference circuit 420B of FIG. 8 at the bias_p node. From FIG. 8, the reference voltage $V_{REF}$ can be expressed as:

$$V_{REF}=V_t+\sqrt{2*I/\beta_{820}} \quad (12)$$

Upon substituting I from Equation 4 into Equation 10, $$V_{REF}=V_t+\sqrt{2*8*\beta_{530A}/\beta_{820}*\ln^2(S)}*V_T \quad (13)$$

$$V_{REF}=V_t+K_1*V_T \quad (14)$$

By changing the sizes of transistors 530A and 820, the value of $K_1$ can be manipulated to cancel out the $V_t$ variations with respect to temperature. Assuming that $V_t$ variation with respect to temperature is mainly with Bulk Fermi Potential ($2\phi_F$) and mathematics, the following expression for $V_{REF}$ can be derived:

$$V_{REF}=V_{FB}+Q_B/C_{OX}+V_{G0}+3V_{T0} \quad (15)$$

Where $V_{G0}$ represents the extrapolated silicon band-gap at T=0° K. and $V_{T0}$ represents the thermal voltage at room temperature. It is appreciated that the expression for the reference voltage in Equation 15 is substantially independent of temperature. The temperature dependent term ($2\phi_F$) in the threshold voltage ($V_t$) is cancelled with weighted PTAT voltage from the current reference circuit 410B. $V_{REF}$ is also substantially independent of external voltage because it is driven by the self-biased current reference 410B. However, $V_{REF}$ does depend on process ($1/C_{OX}$), which is adaptive. In other words, the circuit will produce a higher $V_{REF}$ at slow PMOS and slow NMOS, and it will produce a lower $V_{REF}$ at fast PMOS and fast NMOS.

This embodiment has several benefits over conventional voltage reference circuits. For example, the circuit's dependency on MOSFET models has been minimized and depends on Vt modeling. The circuit also has low power requirements ($\leq 300$ nA of current). The circuit can also operate at low voltage (up to Vt+300 mV). Additionally, in one embodiment, the circuit's temperature coefficient is less than 200 ppm/° C. Furthermore, the reference may be adaptive with respect to process.

Thus, embodiments of the present invention are able to provide a reference voltage without using resistors or amplifiers. As a result, circuit area and operating current are reduced. Moreover, problems associated with resistor matching are eliminated. These advantages translate generally into lower cost and lower power consumption compared to conventional voltage reference circuits.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A circuit for generating a reference voltage, said circuit comprising:
   a current reference circuit comprising a PTAT generator, wherein the PTAT generator is configured to generate a PTAT voltage and a bias voltage;
   a first transistor coupled with a first output of the current reference circuit, wherein said first transistor is operable to generate a bias current that is proportional to a reference current of said current reference circuit, wherein said reference current is proportional to a temperature measurement;
   a diode-connected transistor coupled with said first transistor, wherein the diode-connected transistor is sized to compensate for a temperature-based voltage variation;

a second transistor coupled with said diode-connected transistor, wherein said reference voltage is generated at a drain of said diode-connected transistor, and wherein a negative temperature variation of the second transistor is at least partially cancelled by a positive temperature coefficient of the diode-connected transistor; and a voltage follower circuit configured to generate a bandgap reference voltage based on said reference voltage, wherein a transistor of the voltage follower circuit is biased by the bias voltage of the PTAT generator.

2. The circuit as recited in claim 1, wherein said current reference circuit further comprises:

a current mirror coupled with said first transistor and with said

PTAT generator, wherein said PTAT generator is configured to generate the PTAT voltage without use of an operational amplifier;

a voltage to current converter coupled with said PTAT generator and operable to convert said PTAT voltage to a PTAT current; and a bias circuit coupled with said current mirror and said voltage to current converter, wherein said bias circuit is operable to bias said voltage to current converter.

3. The circuit as recited in claim 1 wherein a variation of said bandgap reference voltage across a wafer is substantially 1.24V±20 mV.

4. The circuit as recited in claim 1 having an operating current less than 100 nA.

5. A voltage reference circuit comprising:

a current reference circuit comprising a PTAT generator, wherein the PTAT generator is configured to generate a PTAT voltage and a bias voltage a PMOS transistor coupled with an output of a current reference circuit, wherein said current reference circuit is configured to generate a reference current that is proportional to a temperature measurement; and a diode-connected transistor coupled with said PMOS transistor, wherein the diode-connected transistor is sized to compensate for a temperature-based voltage variation of the voltage reference circuit, and wherein a voltage reference is generated at a drain of said diode-connected transistor, and wherein the current reference circuit and the voltage reference circuit are resistor free;

a second transistor coupled with said diode-connected transistor, wherein a negative temperature variation of the second transistor is at least partially cancelled by a positive temperature coefficient of the diode-connected transistor; and a voltage follower circuit configured to generate a bandgap reference voltage based on said reference voltage, wherein a transistor of the voltage follower circuit is biased by the bias voltage of the PTAT generator.

6. The voltage reference circuit as recited in claim 5, wherein said current reference circuit further comprises:

a current mirror coupled with said PMOS transistor and with said

PTAT generator, wherein said PTAT generator is operable to generate a PTAT voltage without use of an operational amplifier;

a voltage to current converter coupled with said PTAT generator and operable to convert said PTAT voltage to a PTAT current; and a bias circuit coupled with said current mirror and said voltage to current converter, wherein said bias circuit is operable to bias said voltage to current converter.

7. The voltage reference circuit as recited in claim 5 having an operating current less than 300 nA.

8. The voltage reference circuit as recited in claim 5 wherein said voltage reference circuit is coupled with an external voltage source that is equal to or less than Vt+300 mV, wherein Vt is a threshold voltage of one of said PMOS transistor or a NMOS transistor.

9. The voltage reference circuit as recited in claim 5 having a temperature coefficient of less than 200 ppm/° C.

10. The voltage reference circuit as recited in claim 5 wherein said voltage reference is independent of temperature.

11. The voltage reference circuit as recited in claim 5 wherein said voltage reference is independent of an external voltage supplied to the voltage reference circuit.

* * * * *